(12) United States Patent
Chang et al.

(10) Patent No.: US 9,786,602 B2
(45) Date of Patent: Oct. 10, 2017

(54) INTERCONNECTION STRUCTURE AND METHODS OF FABRICATION THE SAME

(71) Applicant: Taiwan Semiconductor Manufacturing Company, Ltd., Hsin-Chu (TW)

(72) Inventors: Shih-Ming Chang, Hsinchu County (TW); Chih-Tsung Shih, Hsinchu (TW)

(73) Assignee: TAIWAN SEMICONDUCTOR MANUFACTURING COMPANY, LTD., Hsin-chu (TW)

(*) Notice: Subject to any disclaimer, the term of this patent is extended or adjusted under 35 U.S.C. 154(b) by 0 days.

(21) Appl. No.: 14/832,072

(22) Filed: Aug. 21, 2015

(65) Prior Publication Data

US 2017/0053870 A1 Feb. 23, 2017

(51) Int. Cl.
| | |
|---|---|
| *H01L 23/528* | (2006.01) |
| *H01L 23/522* | (2006.01) |
| *H01L 21/3213* | (2006.01) |
| *H01L 21/768* | (2006.01) |
| *H01L 21/311* | (2006.01) |

(52) U.S. Cl.
CPC .... *H01L 23/5283* (2013.01); *H01L 21/31116* (2013.01); *H01L 21/31144* (2013.01); *H01L 21/32136* (2013.01); *H01L 21/32139* (2013.01); *H01L 21/76816* (2013.01)

(58) Field of Classification Search
None
See application file for complete search history.

(56) References Cited

U.S. PATENT DOCUMENTS

| | | | |
|---|---|---|---|
| 6,282,226 B1* | 8/2001 | Furukawa | ............... H01S 5/10 372/94 |
| 7,667,271 B2 | 2/2010 | Yu et al. | |
| 7,910,453 B2 | 3/2011 | Xu et al. | |
| 8,377,779 B1 | 2/2013 | Wang | |
| 8,399,931 B2 | 3/2013 | Liaw et al. | |
| 8,652,894 B2 | 2/2014 | Lin et al. | |
| 8,686,516 B2 | 4/2014 | Chen et al. | |
| 8,716,765 B2 | 5/2014 | Wu et al. | |
| 8,723,272 B2 | 5/2014 | Liu et al. | |
| 8,729,627 B2 | 5/2014 | Cheng et al. | |

(Continued)

FOREIGN PATENT DOCUMENTS

TW 201519449 A 5/2015

*Primary Examiner* — Michael Lebentritt
*Assistant Examiner* — Jordan Klein
(74) *Attorney, Agent, or Firm* — Haynes and Boone, LLP

(57) ABSTRACT

A device includes a substrate feature disposed over a substrate. The substrate feature has a first length extending along a first direction and a second length extending along a second direction. The first length is greater than the second length. The device also includes a first material feature disposed over the substrate. The first material feature has a first surface in physical contact with the substrate feature and a second surface opposite to the first surface. The first surface has a third length extending along the first direction and a fourth length extending along the second direction. The third length is greater than the fourth length. The second surface has a fifth length extending along the first direction and a sixth length extending along the second direction. The sixth length is greater than the fifth length.

20 Claims, 18 Drawing Sheets

(56) References Cited

U.S. PATENT DOCUMENTS

| | | | |
|---|---|---|---|
| 8,735,993 B2 | 5/2014 | Lo et al. | |
| 8,736,056 B2 | 5/2014 | Lee et al. | |
| 8,736,059 B2* | 5/2014 | Tsai | H01L 23/481 257/773 |
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 2004/0232555 A1* | 11/2004 | Komatsubara | H01L 21/76838 257/758 |
| 2007/0212866 A1* | 9/2007 | Inomata | H01L 21/76816 438/597 |
| 2007/0278681 A1* | 12/2007 | Yu | H01L 21/76807 257/758 |
| 2008/0087998 A1* | 4/2008 | Kamins | H01L 23/49827 257/686 |
| 2010/0072629 A1* | 3/2010 | Lee | H01L 23/53219 257/774 |
| 2010/0167186 A1* | 7/2010 | Jang | B82Y 10/00 430/5 |
| 2010/0308469 A1* | 12/2010 | Tsai | H01L 21/76804 257/774 |
| 2011/0156252 A1* | 6/2011 | Lin | H01L 21/568 257/738 |
| 2012/0038056 A1* | 2/2012 | Cabral, Jr. | H01L 21/31116 257/774 |
| 2012/0086128 A1* | 4/2012 | Ponoth | H01L 21/76897 257/774 |
| 2012/0267776 A1* | 10/2012 | Nin | H01L 23/481 257/737 |
| 2014/0001574 A1 | 1/2014 | Chen et al. | |
| 2014/0110755 A1 | 4/2014 | Colinge | |
| 2014/0151812 A1 | 6/2014 | Liaw | |
| 2015/0028330 A1* | 1/2015 | Yamazaki | H01L 29/42384 257/43 |
| 2015/0162281 A1* | 6/2015 | Kato | H01L 21/76802 257/401 |
| 2015/0348832 A1* | 12/2015 | Bruce | H01L 21/76885 257/761 |
| 2016/0064274 A1* | 3/2016 | Peng | H01L 21/76813 257/774 |

* cited by examiner

INTERCONNECTION STRUCTURE AND METHODS OF FABRICATION THE SAME

BACKGROUND

The integrated circuit (IC) industry has experienced rapid growth. Technological advances in IC design and material have produced generations of ICs where each generation has smaller and more complex circuits than previous generations. In the course of IC evolution, functional density (i.e., the number of interconnected devices per chip area) has generally increased while geometry size (i.e., the smallest component (or line) that can be created using a fabrication process) has decreased.

This scaling down process generally provides benefits by increasing production efficiency and lowering associated costs. Such scaling down has also increased the complexity of IC processing and manufacturing. For these advances to be realized, similar developments in IC processing and manufacturing are needed. One area is the wiring, or interconnects, between the transistors and other devices. Although existing methods of fabricating IC devices have been generally adequate for their intended purposes, they have not been entirely satisfactory in all respects. For example, challenges rise to develop improved dielectric and metal interconnection structures.

BRIEF DESCRIPTION OF THE DRAWINGS

Aspects of the present disclosure are best understood from the following detailed description when read in association with the accompanying figures. It is noted that, in accordance with the standard practice in the industry, various features in drawings are not drawn to scale. In fact, the dimensions of illustrated features may be arbitrarily increased or decreased for clarity of discussion.

DETAILED DESCRIPTION

Figure 1:
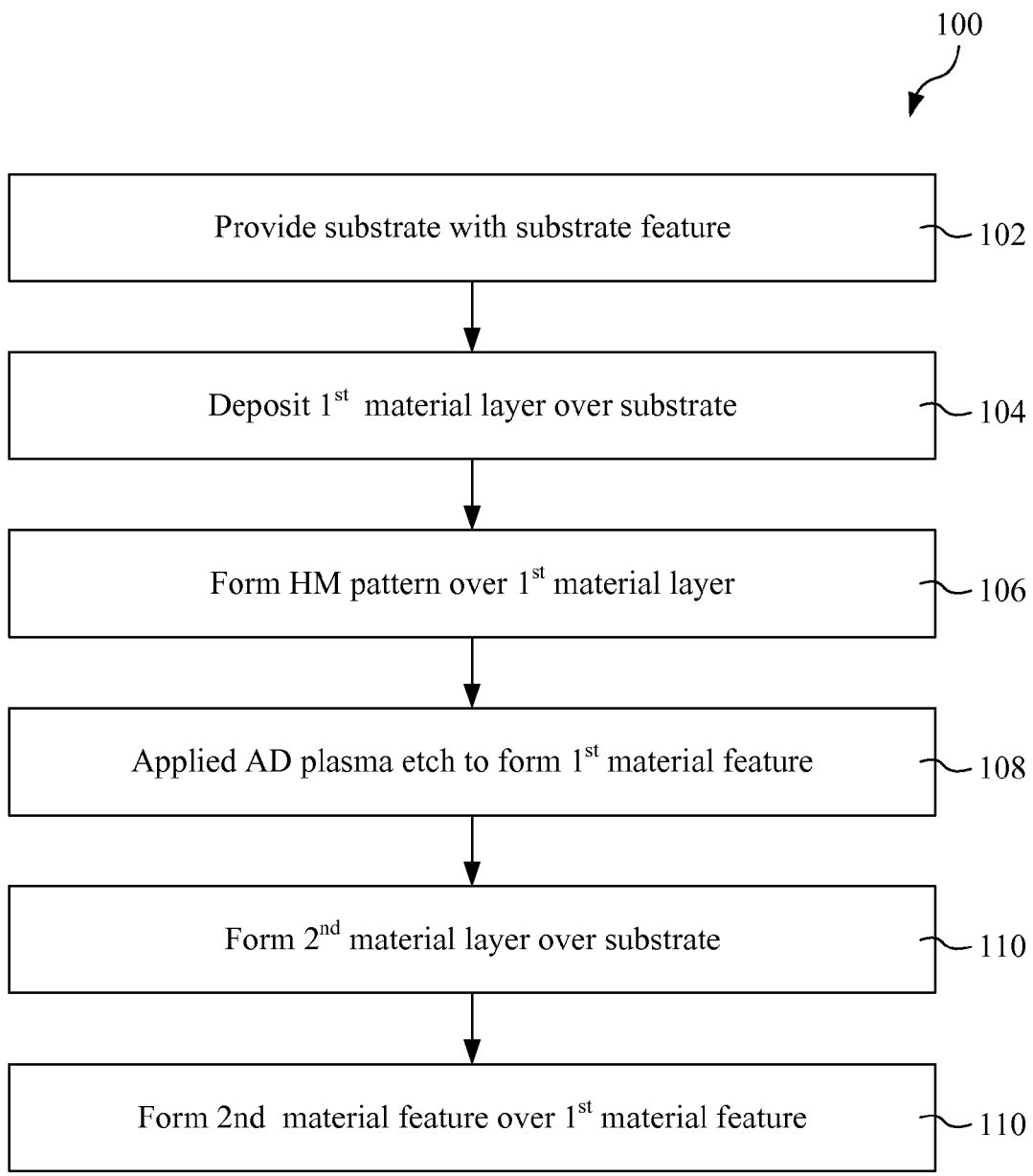
FIG. 1 is a flowchart of an example method for fabricating a semiconductor device constructed in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flowchart of a method 100 of fabricating one or more semiconductor devices in accordance with some embodiments. The method 100 is discussed in detail below, with reference a semiconductor device 200, shown in FIGS. 4A to 6D.

Referring to FIGS. 1 and 2A-2C, the method 100 starts at step 102 by providing a substrate 210 having a substrate feature 215. The substrate 210 includes silicon. Alternatively or additionally, the substrate 210 may include other elementary semiconductor such as germanium. The substrate 210 may also include a compound semiconductor such as silicon carbide, gallium arsenic, indium arsenide, and indium phosphide. The substrate 210 may include an alloy semiconductor such as silicon germanium, silicon germanium carbide, gallium arsenic phosphide, and gallium indium phosphide. In one embodiment, the substrate 210 includes an epitaxial layer. For example, the substrate 210 may have an epitaxial layer overlying a bulk semiconductor. Furthermore, the substrate 210 may include a semiconductor-on-insulator (SOI) structure. For example, the substrate 210 may include a buried oxide (BOX) layer formed by a process such as separation by implanted oxygen (SIMOX) or other suitable technique, such as wafer bonding and grinding.

The substrate 210 may also include various p-type doped regions and/or n-type doped regions, implemented by a process such as ion implantation and/or diffusion. Those doped regions include n-well, p-well, light doped region (LDD), heavily doped source and drain (S/D), and various channel doping profiles configured to form various IC devices, such as a complimentary metal-oxide-semiconductor field-effect transistor (CMOSFET), imaging sensor, and/or light emitting diode (LED). The substrate 210 may further include other functional features such as a resistor or a capacitor formed in and on the substrate.

The substrate 210 may also include a plurality of inter-level dielectric (ILD) layers and conductive features integrated to form an interconnect structure configured to couple the various p-type and n-type doped regions and the other functional features (such as gate electrodes), resulting a functional integrated circuit. In one example, the substrate 210 may include a portion of the interconnect structure and the interconnect structure includes a multi-layer interconnect (MLI) structure and an ILD layer integrated with a MLI structure, providing an electrical routing to couple various devices in the substrate 210 to the input/output power and signals. The interconnect structure includes various metal lines, contacts and via features (or via plugs). The metal lines provide horizontal electrical routing. The contacts provide vertical connection between silicon substrate and metal lines while via features provide vertical connection between metal lines in different metal layers.

Figure 2A:
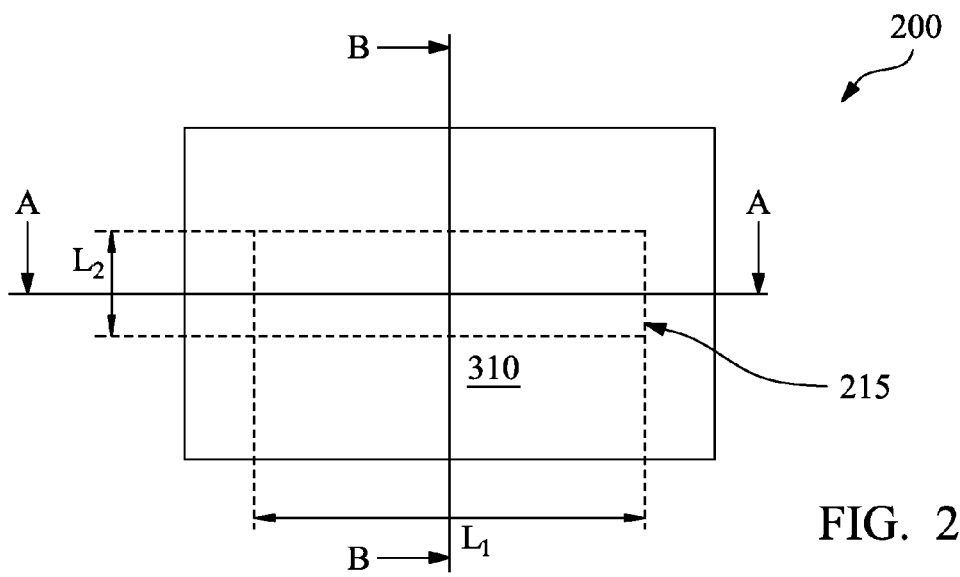
FIG. 2A is a top view of an example of a device in accordance with some embodiments.
Figure 2B:
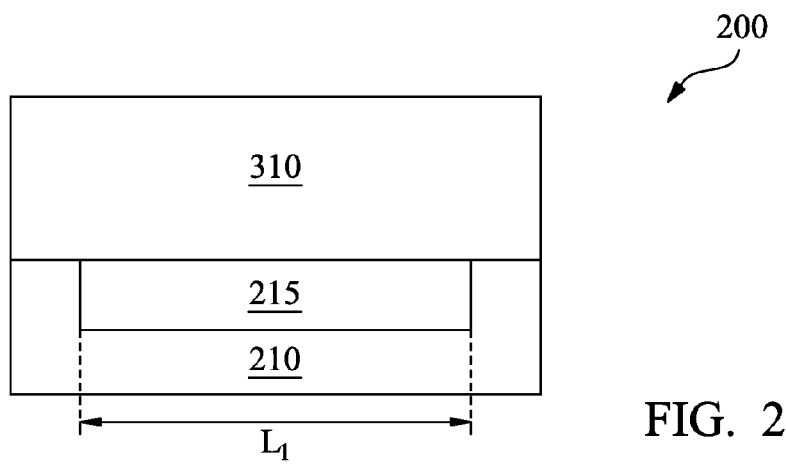
FIG. 2B is a cross section view of an example device in accordance with some embodiments, along the line A-A in FIG. 2A.
Figure 2C:
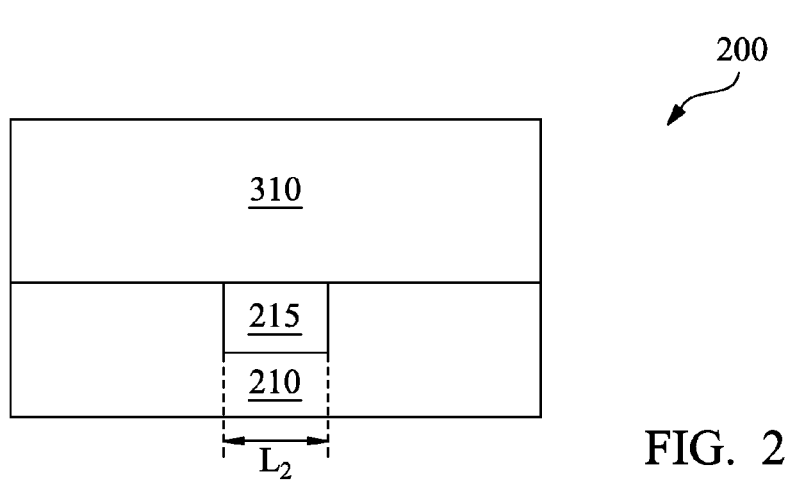
FIG. 2C is a cross section view of an example device in accordance with some embodiments, along the line B-B in FIG. 2A.
Figure 3A:
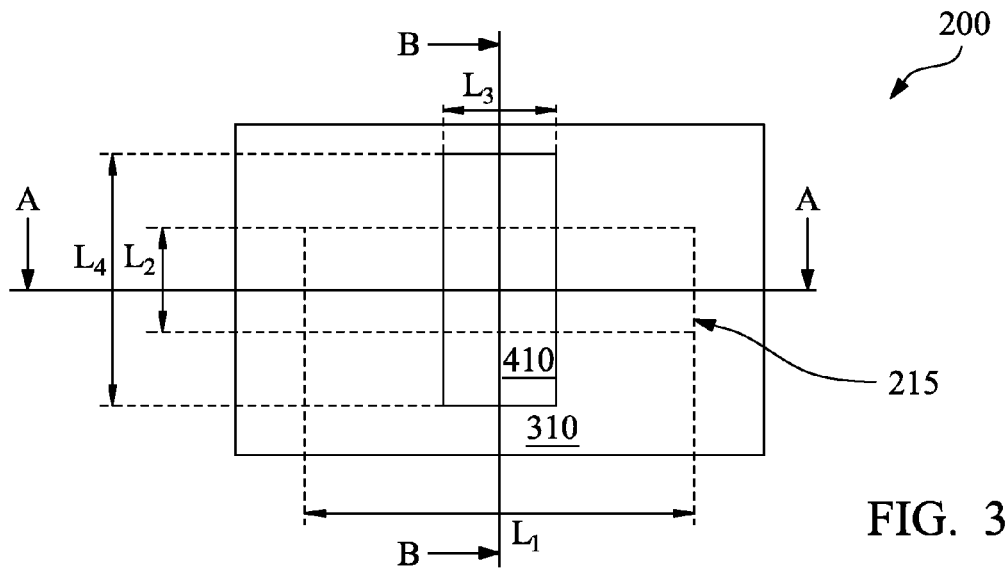
FIG. 3A is a top view of an example of a device in accordance with some embodiments.
Figure 3B:
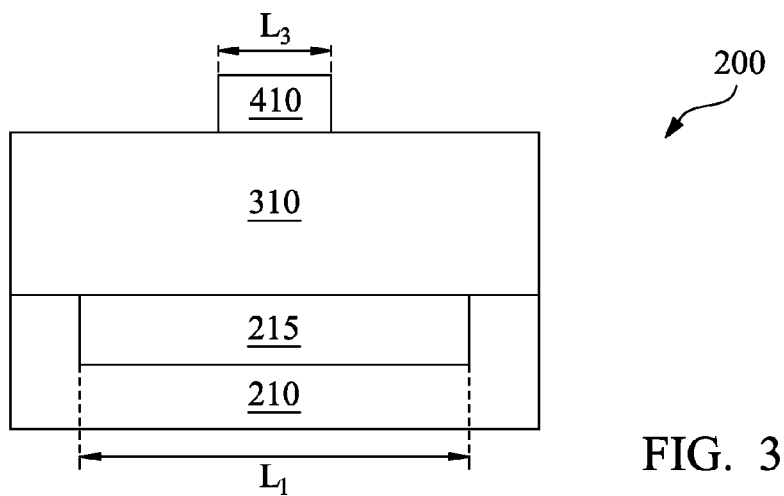
FIG. 3B is a cross-sectional views of an example device in accordance with some embodiments, along the line A-A in FIG. 3A.
Figure 3C:
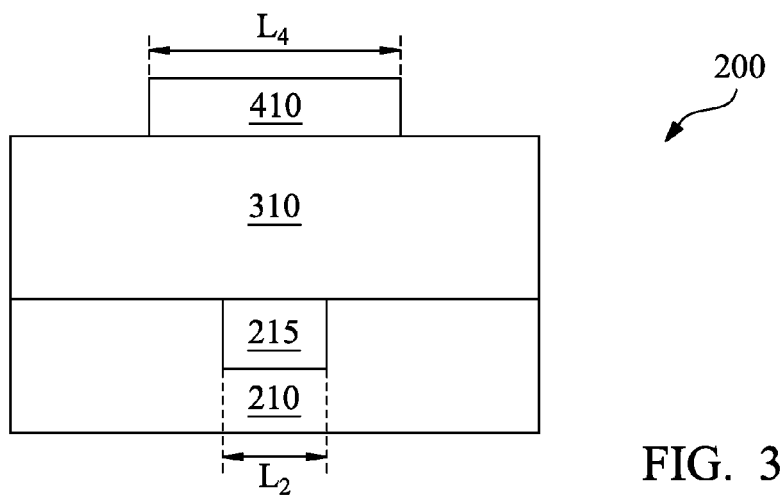
FIG. 3C is a cross section view of an example device in accordance with some embodiments, along the line B-B in FIG. 3A.
Figure 3D:
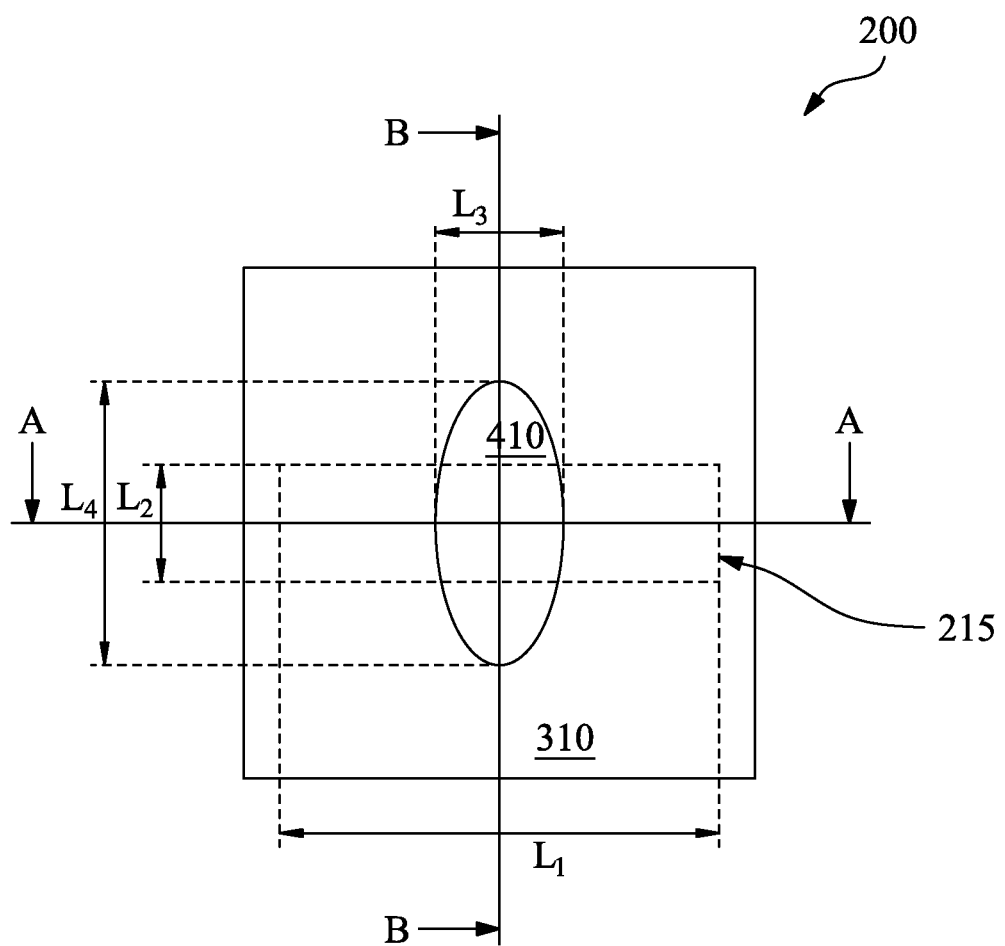
FIG. 3D is a top view of an example of a device in accordance with some embodiments.

In the present embodiment, the substrate feature 215 has a first length $L_1$ extending along a first direction A-A and a second length $L_2$ extending along a second direction B-B. In some embodiments, the second direction B-B is perpendicular to the first direction A-A. In some embodiments, the first length $L_1$ may be greater than the second length $L_2$. For example, the substrate feature 215 has a rectangular shape, as shown in FIGS. 2A-2C, where it has the first length $L_1$ extending along the first direction A-A and the second length $L_2$ (width) extending along the second direction B-B.

The substrate feature 215 may include a gate stack formed by dielectric layers and electrode layers. The dielectric layers may include an interfacial layer (IL) and a high-k (HK) dielectric layer deposited by suitable techniques, such as chemical vapor deposition (CVD), atomic layer deposition (ALD), physical vapor deposition (PVD), thermal oxidation, combinations thereof, or other suitable techniques. The electrode layers may include a single layer or multi layers, such as metal layer, liner layer, wetting layer, and adhesion layer, formed by ALD, PVD, CVD, or other suitable process.

The substrate feature 215 may also include an isolation feature. The isolation feature separates various device regions in the substrate 210. The isolation features include different structures formed by using different processing technologies. For example, the isolation features may include shallow trench isolation (STI) features. The formation of a STI may include etching a trench in the substrate 210 and filling in the trench with insulator materials such as silicon oxide, silicon nitride, or silicon oxynitride. The filled trench may have a multi-layer structure such as a thermal oxide liner layer with silicon nitride filling the trench. A chemical mechanical polishing (CMP) may be performed to polish back excessive insulator materials and planarize the top surface of the isolation features.

The substrate feature 215 also may include a conductive feature, such as a source and drain (S/D), a gate electrode, and/or a portion of the interconnect structure, such as a metal line, and/or contact, metal via. In one embodiment, the conductive features include electrodes, capacitors, resistors and/or a portion of a resistor. The conductive features may be formed by one or more procedures such as lithography, etching and deposition.

Referring also to FIGS. 1 and 2A-2C, the method 100 proceeds to step 104 by depositing a first material layer 310 over the substrate 210, including the substrate feature 215. The first material layer 310 may include a dielectric layer, such as silicon oxide, silicon nitride, or silicon oxynitride, low-k dielectric material, and/or other suitable materials. The first material layer 310 may also include a conductive layer such as polysilicon, metal, and/or other suitable material. In some embodiments, the first material layer 310 may include multiple film layers. The first material layer 310 may be deposited over the substrate 210 by suitable techniques, such as CVD, ALD, PVD, thermal oxidation, spin-on coating, or combinations thereof, or other suitable techniques. In the present embodiment, the first material layer 310 is deposited over and in physical contact with a surface of the substrate feature 215.

Referring to FIGS. 1 and 3A-3D, the method 100 proceeds to step 106 by forming a hard mask (HM) pattern 410 over the first material layer 310. In some embodiments, the HM pattern 410 is formed by processes of deposition, lithography and etching process. In some embodiments, the HM pattern 410 is a photoresist pattern formed by a lithography process. An exemplary lithography process may include forming a resist layer, exposing the resist layer by a lithography exposure process, performing a post-exposure bake process, and developing the resist layer to form the patterned resist layer.

The HM pattern 410 may include a rectangular shape (shown in FIG. 3A), an oval shape (shown in FIG. 3D), or other proper shape. The HM pattern 410 may have a third length $L_3$ extending along the first direction A-A and a fourth length $L_4$ extending along the second direction B-B. In some embodiments, the third length $L_3$ is shorter than the fourth length $L_4$. The HM pattern 410 aligns to the substrate feature 215 such that, in a top view, the HM pattern 410 overlaps with a portion of the substrate feature 215. In such a scenario, the longer length of the HM pattern 410, the fourth length $L_4$, extends along a different direction than the longer length of the substrate feature 215, the first length $L_1$.

Referring to FIGS. 1 and 4A-4C, the method 100 proceeds to step 108 by etching the first material layer 310 by using the HM pattern 410 as an etch mask to form a first material feature 510. When a material layer is etched through a HM pattern, sometimes after etch, a size of a post-etch feature is different than a size of a HM pattern and this difference is expressed as an etching bias. If the post-etch feature has a greater dimension (in a direction) than the HM pattern has, it is called a positive bias in that direction. If the post-etch feature has a smaller dimension (in a direction) than the HM pattern has, it is called a negative bias in that direction. In the present embodiment, a dynamic-angle (DA) plasma etch is applied and the etching bias is designed to be different among different directions by using the DA plasmas etch process.

Figure 4A:
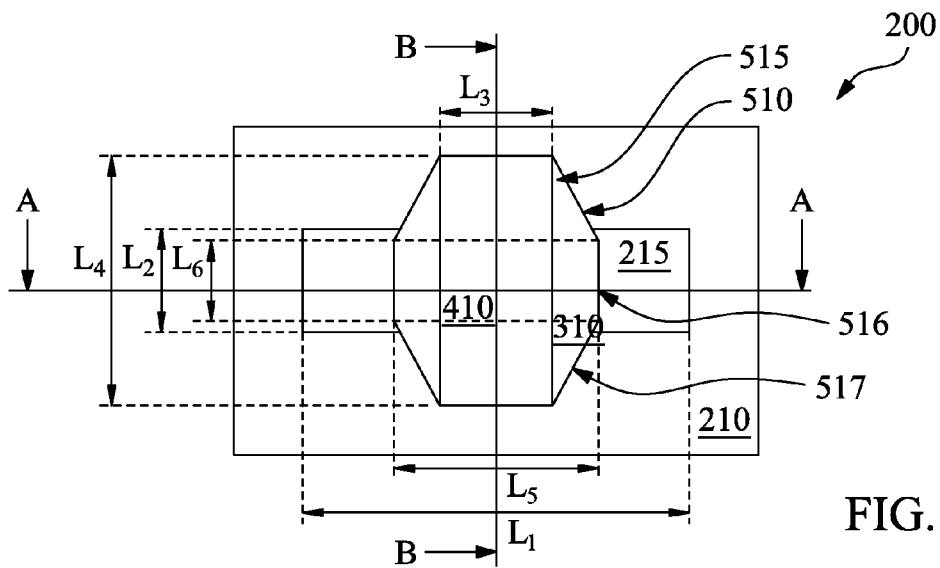
FIG. 4A is a top view of an example of a device in accordance with some embodiments.
Figure 4B:
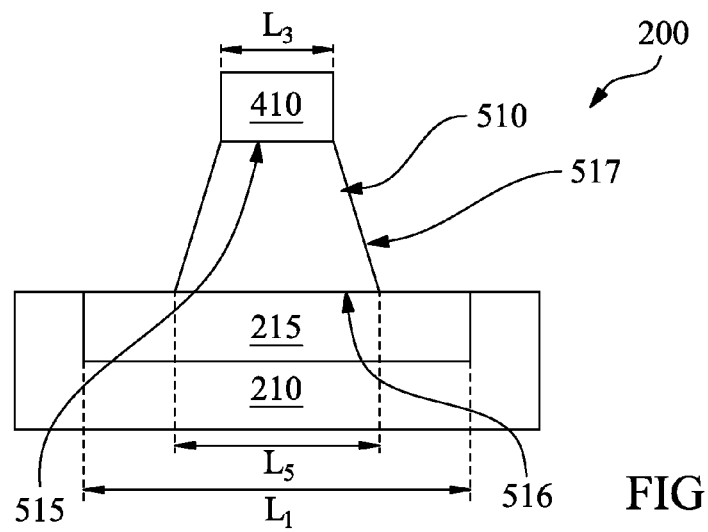
FIG. 4B is a cross-sectional view of an example device in accordance with some embodiments, along the line A-A in FIG. 4A.
Figure 4C:
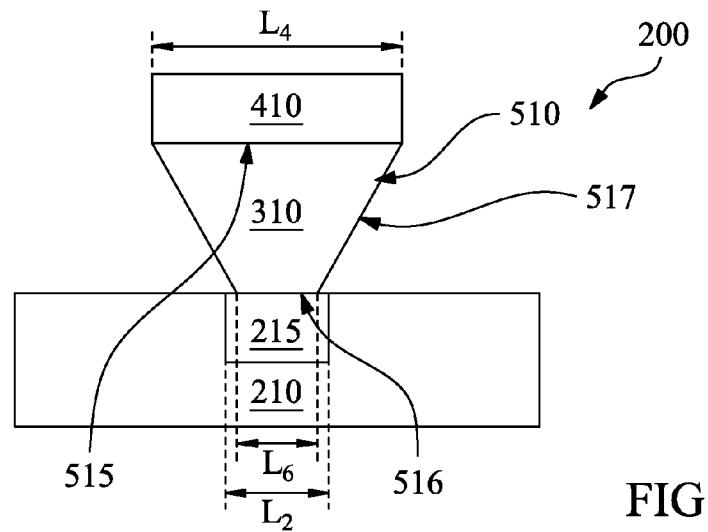
FIG. 4C is a cross-sectional view of an example device in accordance with some embodiments, along the line B-B in FIG. 4A.
Figure 4D:
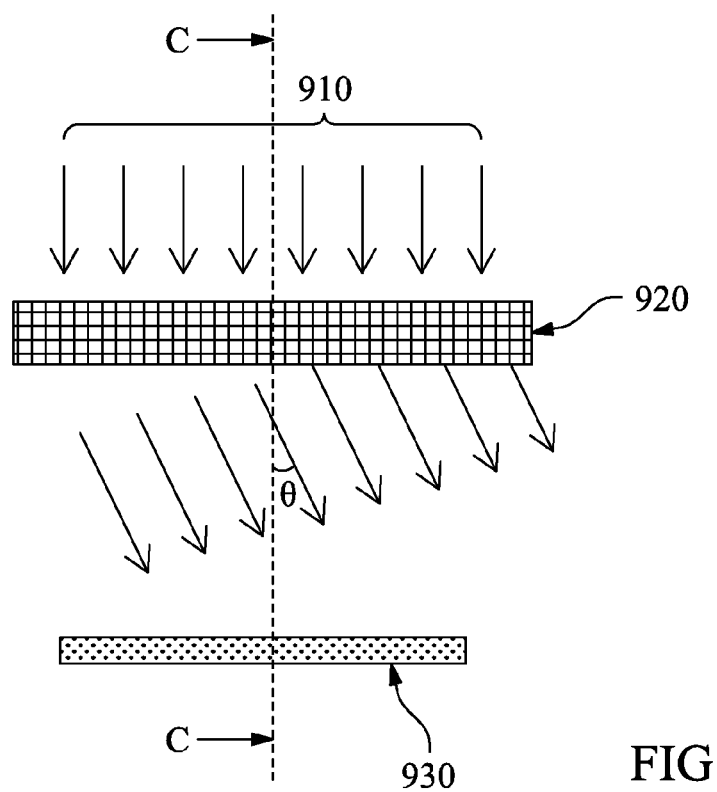
FIGS. 4D-4E are diagrammatic perspective views of an example etching process in accordance with some embodiments.
Figure 4E:
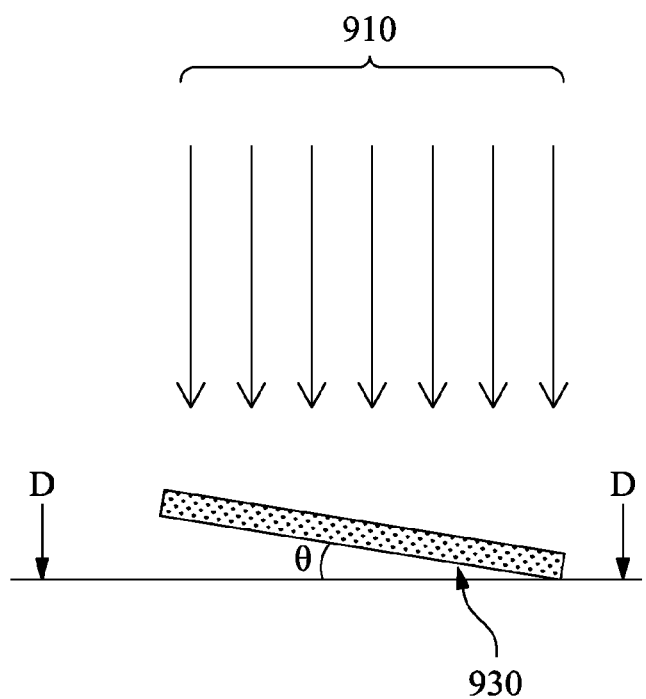

In the DA plasma etch process, as shown in FIGS. 4D-4E, a high-speed stream of glow discharge (plasma) of an appropriate gas mixture, a plasma flux 910, is directed toward a work piece 930 comprising the substrate 210, substrate feature 215 and the first material layer 310 at an angle of incidence θ with respect to a normal line C-C of the surface of the first material layer 310. During the DA plasma etch process, the angle of incidence θ is controlled to change in a dynamic mode and it results in varying etching bias from one direction to another direction. For example, it is designed to be a first etching bias along the first direction A-A and a second etching bias along the second direction B-B, which is different than the first etching bias. The angle of incidence θ may change in a range of about zero degrees to less than about 90 degrees.

In some embodiments, the angle of incidence θ is induced by deflecting the plasma flux 910 by using a deflecting mechanism 920, shown as FIG. 4D. The deflecting mechanism 920 may include a collimator, a magnetic field, an electric field, and/or a combination thereof. Alternatively, the angle of incidence θ is induced by tilting the work piece 930 comprising the substrate 210, substrate feature 215 and the first material layer 310 from a line D-D, here the line D-D is perpendicular to a direction of the plasma flux 910, shown in FIG. 4E.

Referring again to FIGS. 4A-4C, in some embodiments, the DA plasma etch process is controlled such that the etching bias along the first direction A-A is greater than the etching bias along the second direction B-B. In one embodiment, the etching bias along the first direction A-A is a positive etching bias while the etching bias along the second direction B-B is a negative etching bias. In such a scenario, a top surface 515 (in physical contact with the HM pattern 410) of the first material feature 510 has a similar shape and size as the HM pattern 410. And a bottom surface 516 of the material feature 510 (in physical contact with the substrate feature 215) has a fifth length $L_5$ along the first direction A-A, which is longer than the third length $L_3$ and a sixth length $L_6$ along the second direction B-B, which is shorter than the fourth length $L_4$. Since both the substrate feature 215 and the bottom surface 516 of the first material feature 510 have their longer lengths, $L_1$ and $L_5$, along the first direction A-A, it reduces process alignment constrains along the first direction A-A and also provides a larger overlap between the first material feature 215 and the bottom surface 516.

Figure 4F:
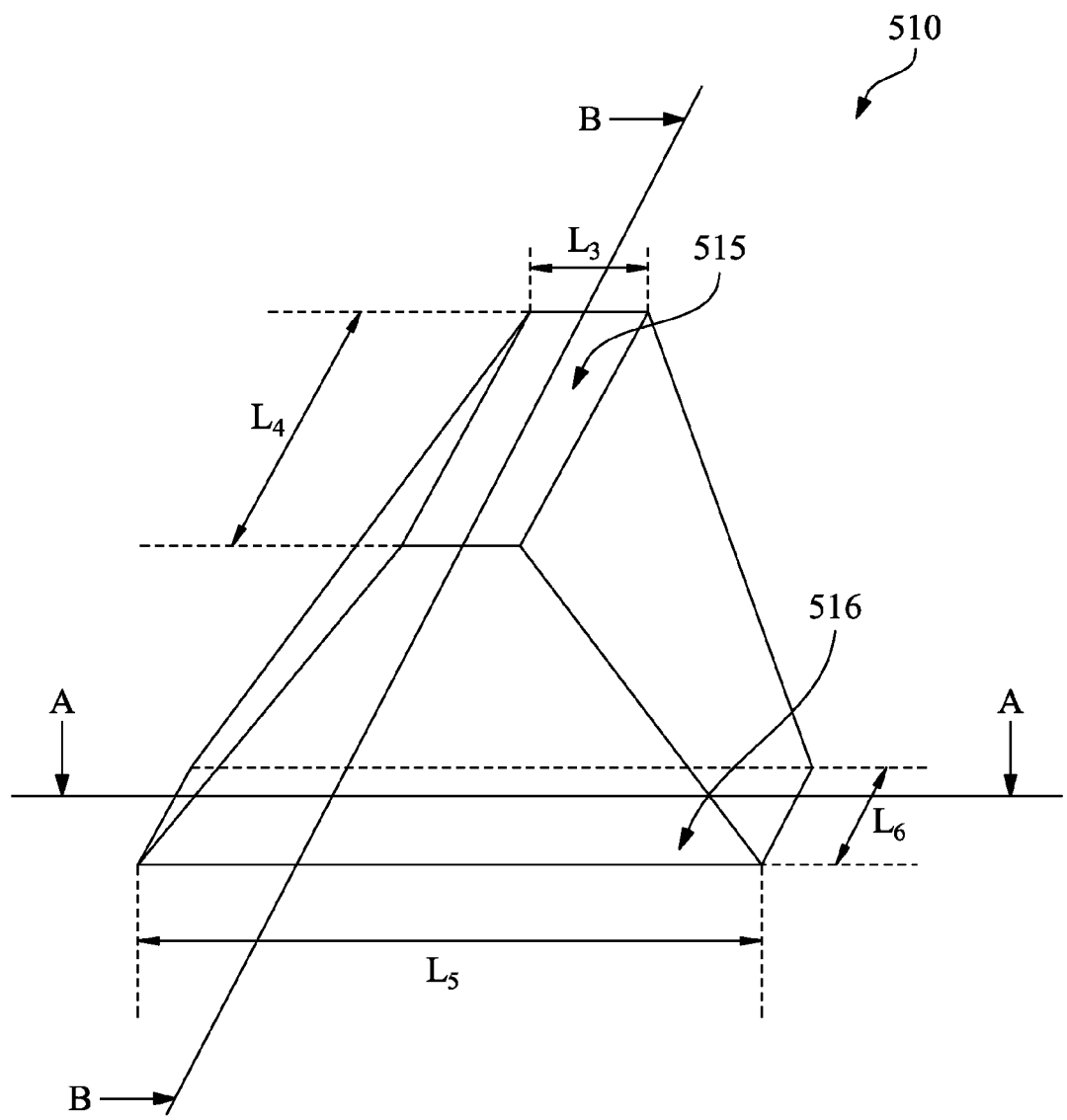
FIG. 4F is a diagrammatic perspective view of an example device in accordance with some embodiments.

As an example, FIG. 4F illustrates the first material feature 510 formed by the etching process, which has a positive etching bias along the first direction A-A and a negative bias along the second direction B-B. The top surface 515 has a rectangular shape, which has the third length $L_3$ along the first direction A-A and the fourth length $L_4$ along the second direction B-B. The bottom surface 516 also has a rectangular shape and has the fifth length $L_5$ along the first direction A-A and the sixth length $L_6$ along the second direction B-B. The fifth length $L_5$ is greater than the third length $L_3$ and the sixth length $L_6$ is shorter than the fourth length $L_4$. In some embodiments, the bottom surface 516 has a different shape than the HM pattern 410.

Figure 4G:
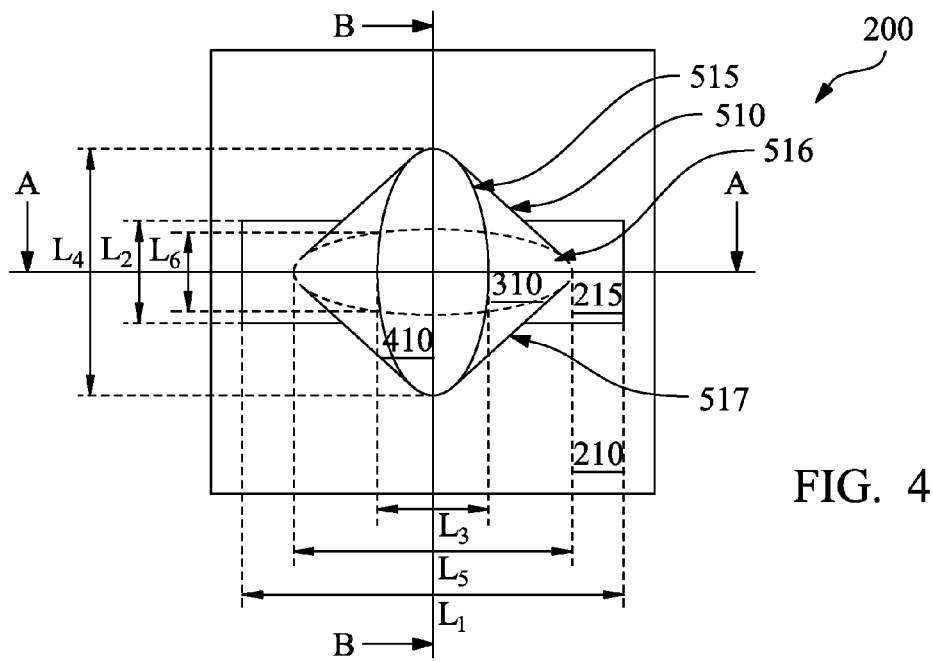
FIG. 4G is a top view of an example of a device in accordance with some embodiments.
Figure 4H:
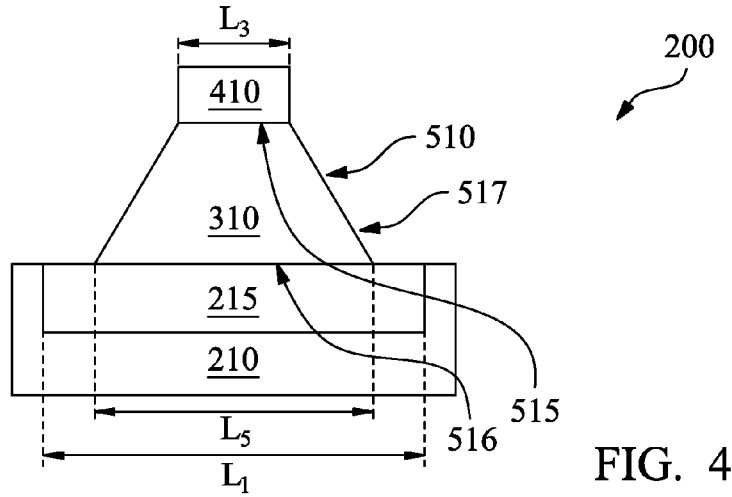
FIG. 4H is a cross-sectional view of an example device in accordance with some embodiments, along the line A-A in FIG. 4G.
Figure 4I:
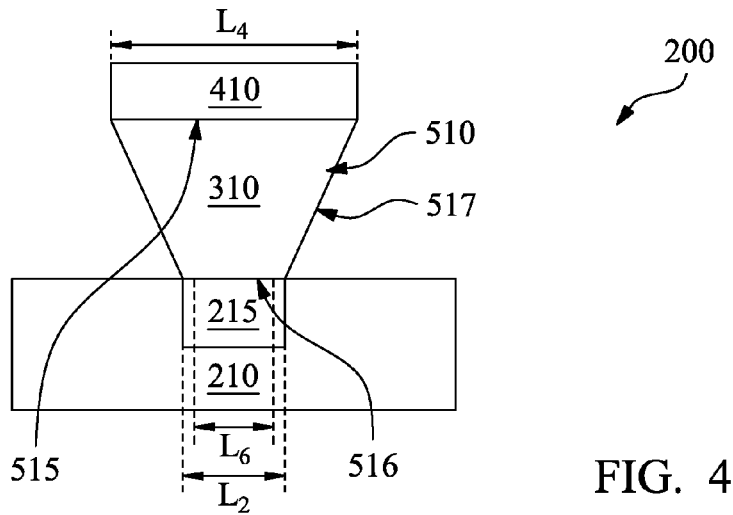
FIG. 4I is a cross-sectional view of an example device in accordance with some embodiments, along the line B-B in FIG. 4G.
Figure 5A:
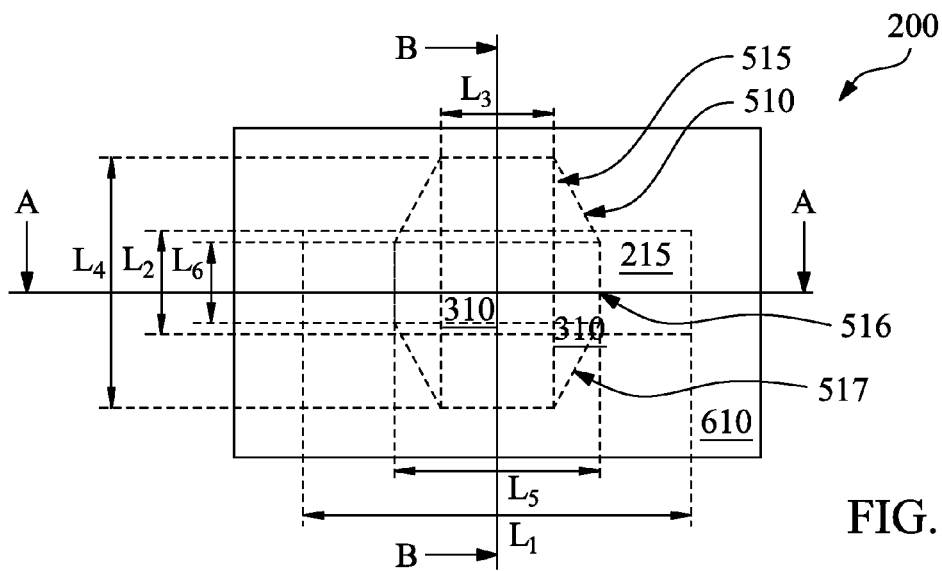
FIG. 5A is a top view of an example of a device in accordance with some embodiments.
Figure 5B:
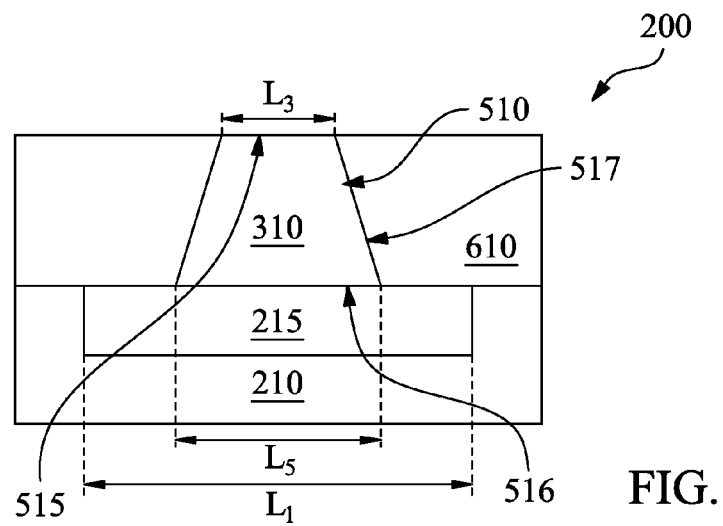
FIG. 5B is a cross-sectional view of an example device in accordance with some embodiments, along the line A-A in FIG. 5A.
Figure 5C:
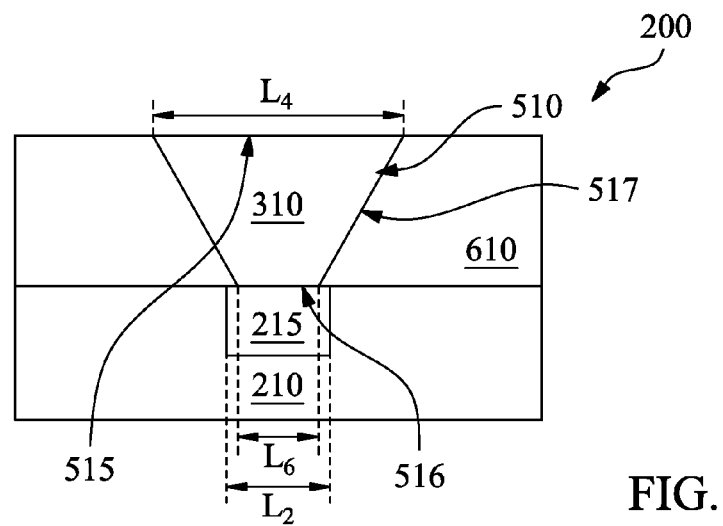
FIG. 5C is a cross-sectional view of an example device in accordance with some embodiments, along the line B-B in FIG. 5A.

FIGS. 4G-4I illustrate another embodiment which is similar to FIGS. 4A-4C except as described differently below. Specifically, FIGS. 4G-4I illustrate the first material feature 510 formed through the oval shape HM pattern 410, described with respect to FIG. 3D. The top surface 515 has an oval shape and the bottom surface 516 (in physical contact with at least a portion of the surface of the substrate feature 215) also has an oval shape.

Referring to FIGS. 1 and 5A-5C, the method 100 proceeds to step 110 by forming a second material layer 610 over the substrate 210, including the first material feature 510. The second material layer 610 may include a dielectric layer, such as silicon oxide, silicon nitride, or silicon oxynitride, low-k dielectric material, and/or other suitable materials. The first material layer 310 may also include a conductive layer such as polysilicon, metal, and/or other suitable material. The second material layer 610 is chosen to be different material than the first material layer 310. For example, the first material layer 310 is a conductive material while the second material layer 610 is a dielectric material. The second material layer 610 may be deposited over the substrate 210 by suitable techniques, such as CVD, ALD, PVD, thermal oxidation, spin-on coating, or combinations thereof, or other suitable techniques. A CMP may be performed to polish back excessive second material layer 610 and expose the top surface 515 of the first material feature 510.

Referring to FIGS. 1 and 6A-6C, the method 100 proceeds to step 112 by forming a second material feature 620 over the second material layer 610, including the first material feature 510. The second material feature 620 may include a conductive layer such as polysilicon, metal, and/or other suitable material. The second material feature 620 may also include a dielectric layer, such as silicon oxide, silicon nitride, or silicon oxynitride, low-k dielectric material, and/or other suitable materials. The second material feature 620 is chosen to be different material than the second material layer 610. For example, the second material feature 620 is a metal layer while the second material layer 610 is a dielectric material. The second material feature 620 may be formed by processes of deposition, lithography and etch.

The second material feature 620 is in physical contact with the top surface 515 of first material feature 510. The second material feature 620 has a seventh length $L_7$ along the first direction A-A and an eighth length $L_8$ along the second direction. In some embodiments, the eighth length $L_8$ is greater than the seventh length $L_7$. Since both of the second material feature 620 and the top surface 515 of the first material feature 510 have their long lengths, $L_8$ and $L_4$, along the second direction B-B, it reduces process alignment constrains along the second direction B-B. At the meantime, in some embodiments, the seventh length $L_7$ is greater than the third length $L_3$ of the top surface 515. Thus the second material feature 620 fully contacts with the top surface 515 to provide a large overlap between the second material feature 620 and the top surface 515.

Figure 6A:
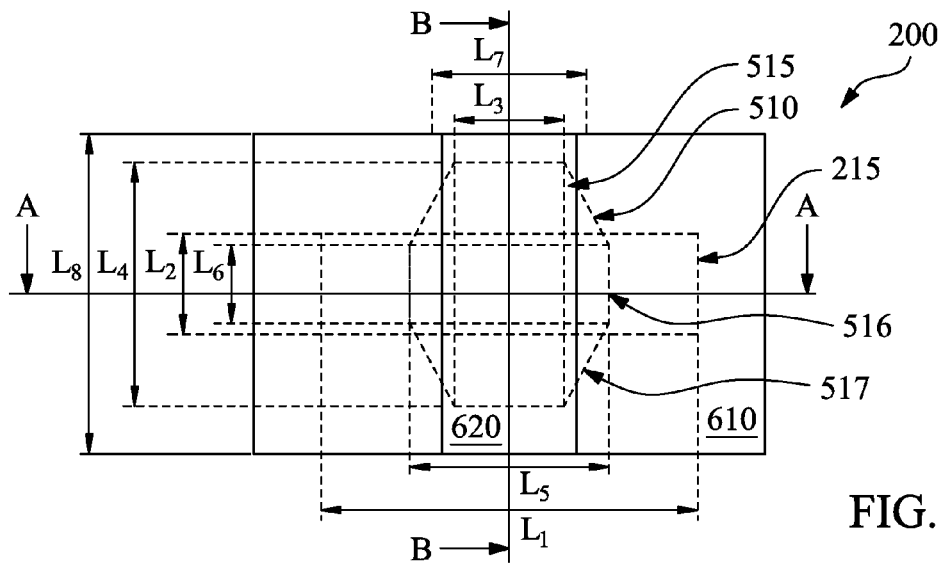
FIG. 6A is a top view of an example of a device in accordance with some embodiments.
Figure 6B:
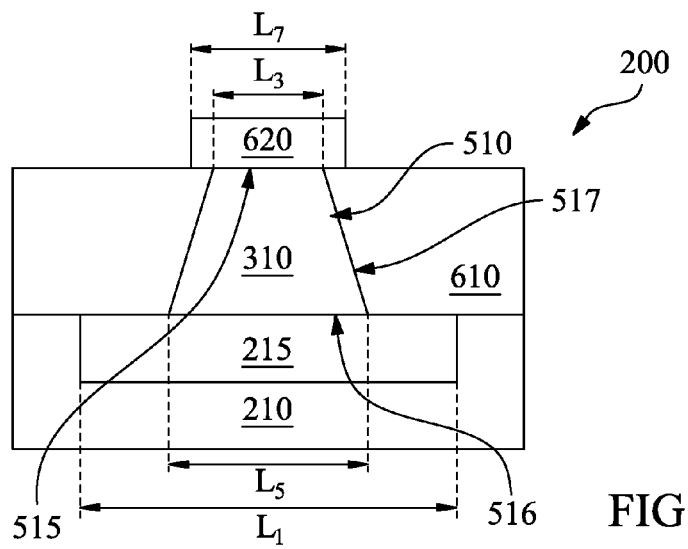
FIG. 6B is a cross-sectional view of an example device in accordance with some embodiments, along the line A-A in FIG. 6A.
Figure 6C:
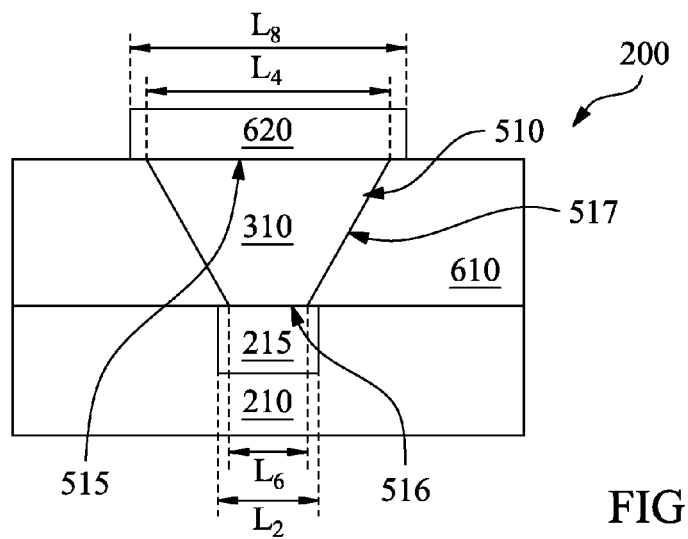
FIG. 6C is a cross-sectional view of an example device in accordance with some embodiments, along the line B-B in FIG. 6A.
Figure 6D:
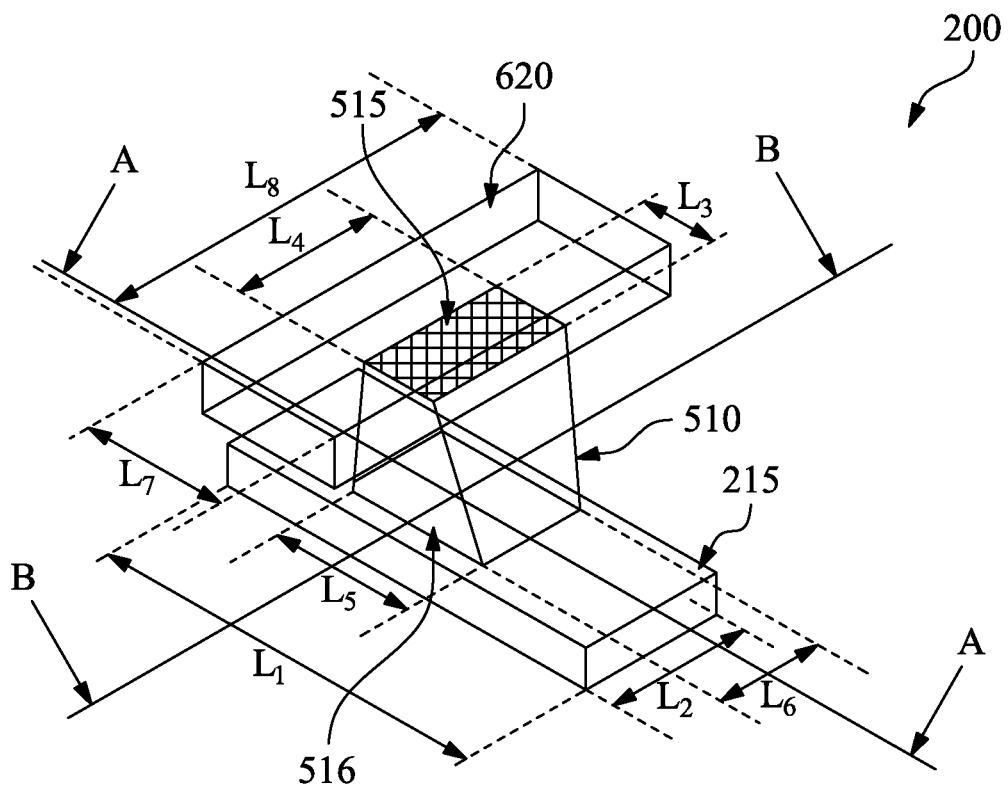
FIG. 6D is a diagrammatic perspective view of an example device in accordance with some embodiments.

Referring to FIG. 6D, in some embodiments, the longer length of the substrate feature 215 extends along a different direction that the longer length of the second material feature 620, such as the first length $L_1$ extends along the first direction A-A while the eighth length $L_8$ extends along the second direction B-B. In such a scenario, the first material feature 510 may serve as an interconnection between the substrate feature 215 and the second material feature 620, such that the top surface 515 extends along the same direction as the eighth length $L_8$ while the bottom surface 516 extends along the same direction as the first length $L_1$. Thus, the first material feature 510 matches both directions of the longer lengths of the second material feature 620 and the substrate feature 215 in which they extend along. This in turn, provides a larger overlay area and increases the critical dimension (CD) design budget during manufacturing.

As an example, the substrate feature 215 is a first metal line extending along the first direction A-A while the second material feature 620 is a second metal line extending along the second direction B-B. In such a scenario, the first material feature 510 servers as a via to connect the first metal line and the second metal line. A proper feature size of the via 510 is important because a smaller size may make high resistance while a bigger size may lead to reduce misalignment allowance. The first material feature 510 provides a larger overlay area to increase misalignment allowance and relaxes feature size constrain, which results in reducing via resistance.

Figure 7:
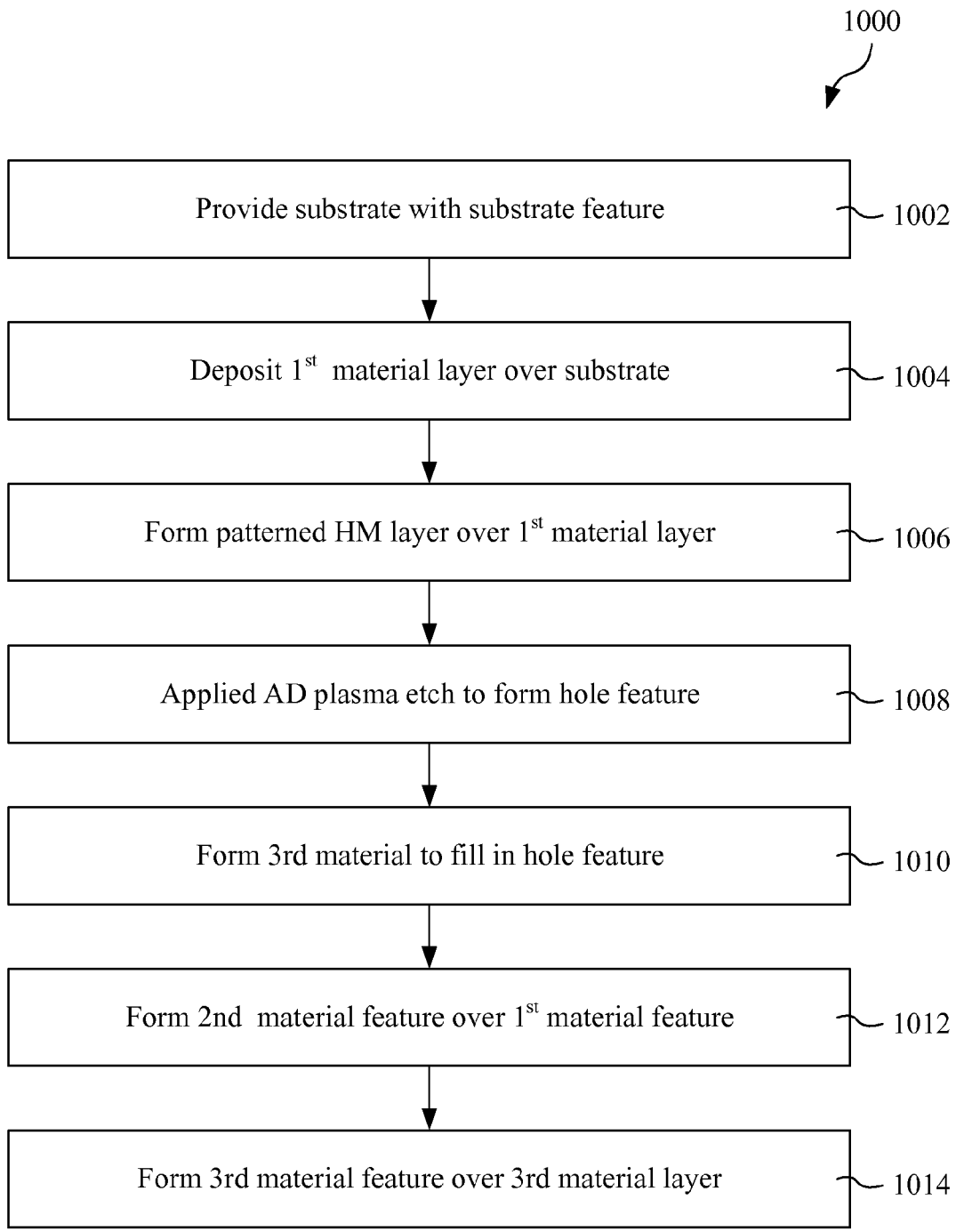
FIG. 7 is a flowchart of another example method for fabricating a semiconductor device constructed in accordance with some embodiments.
Figure 8A:
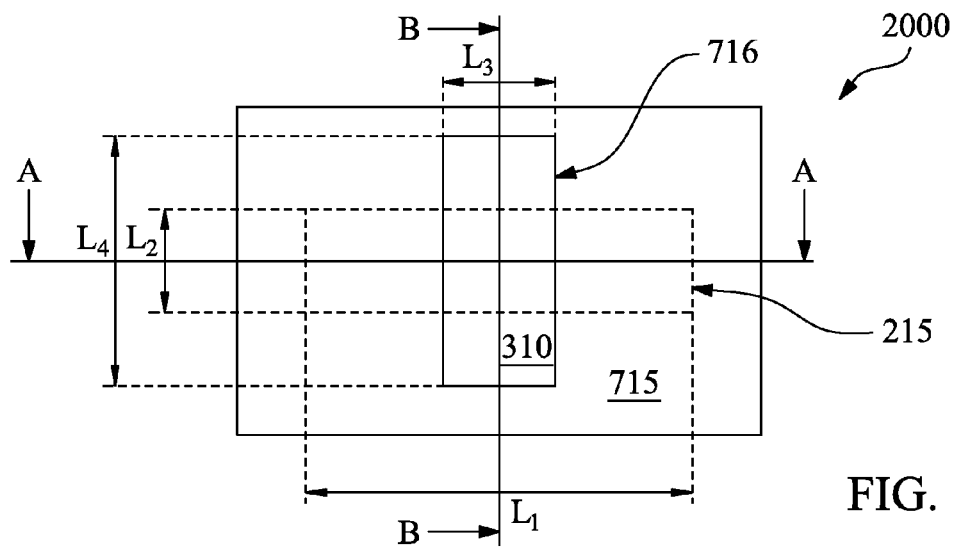
FIG. 8A is a top view of an example of a device in accordance with some embodiments.
Figure 8B:
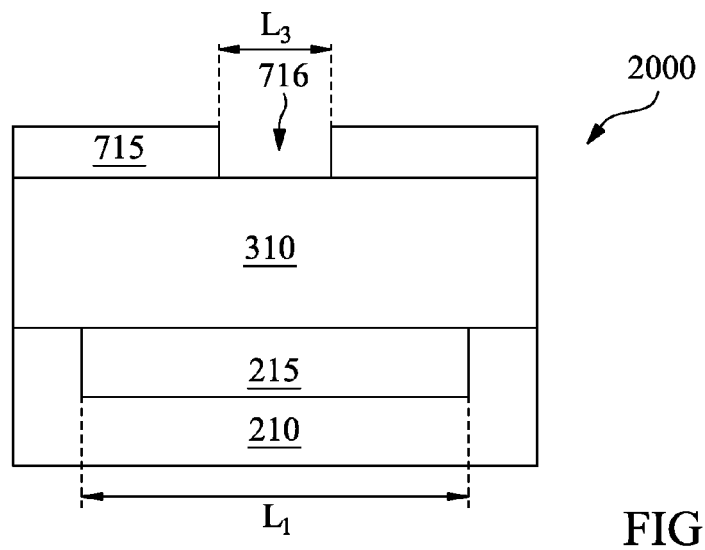
FIG. 8B is a cross-sectional view of an example device in accordance with some embodiments, along the line A-A in FIG. 8A.
Figure 8C:
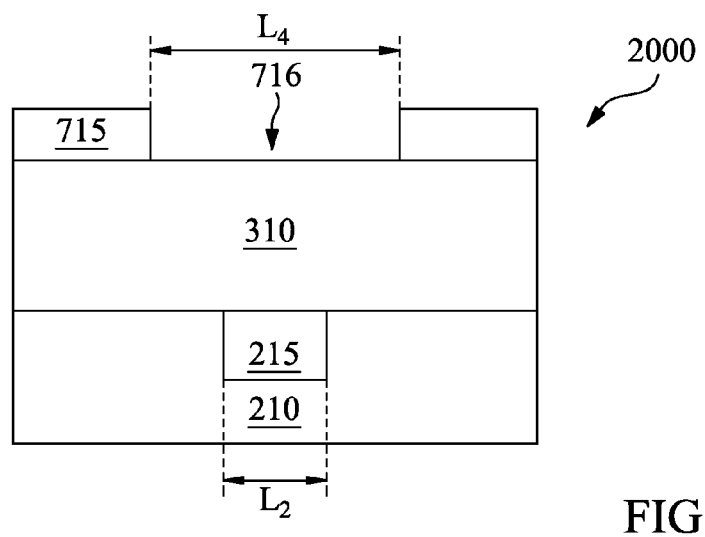
FIG. 8C is a cross-sectional view of an example device in accordance with some embodiments, along the line B-B in FIG. 8A.
Figure 8D:
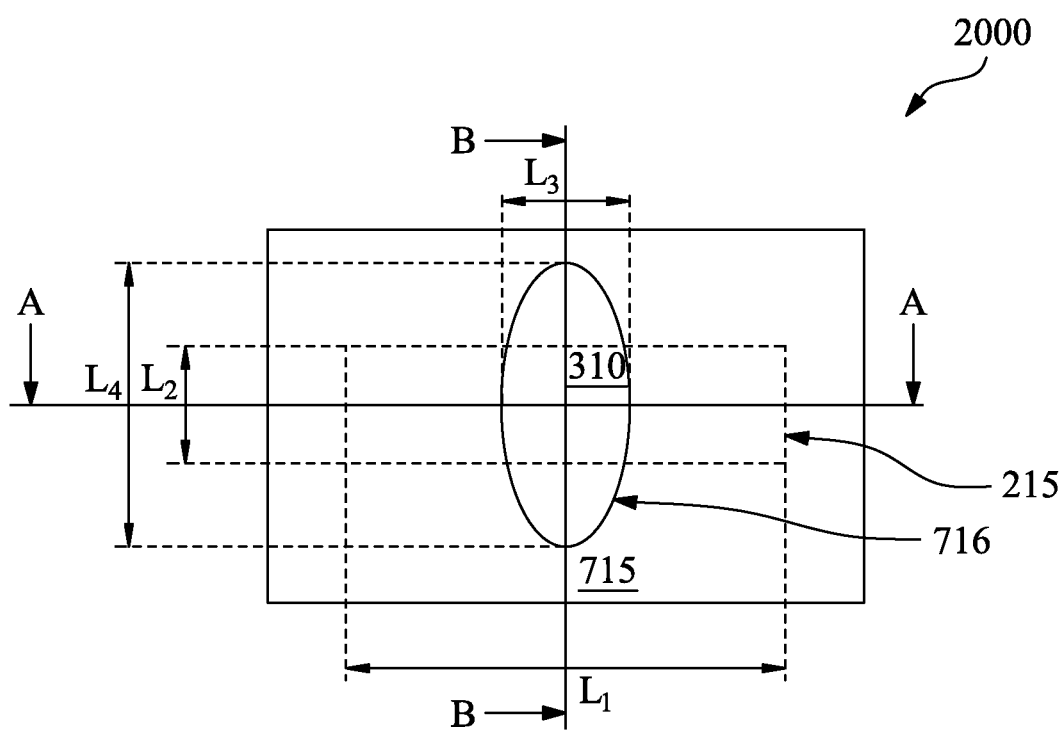
FIG. 8D a top view of another example of a device in accordance with some embodiments.
Figure 9A:
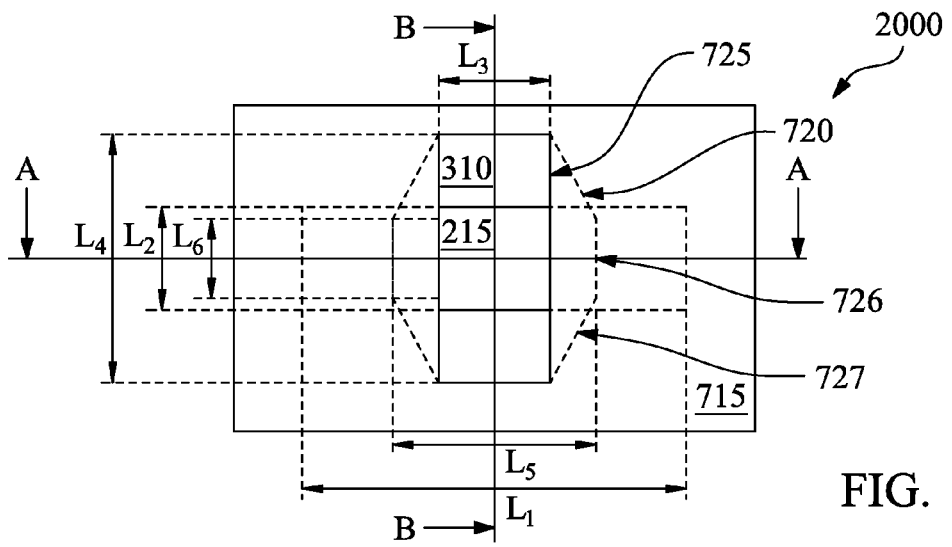
FIG. 9A is a top view of an example of a device in accordance with some embodiments.
Figure 9B:
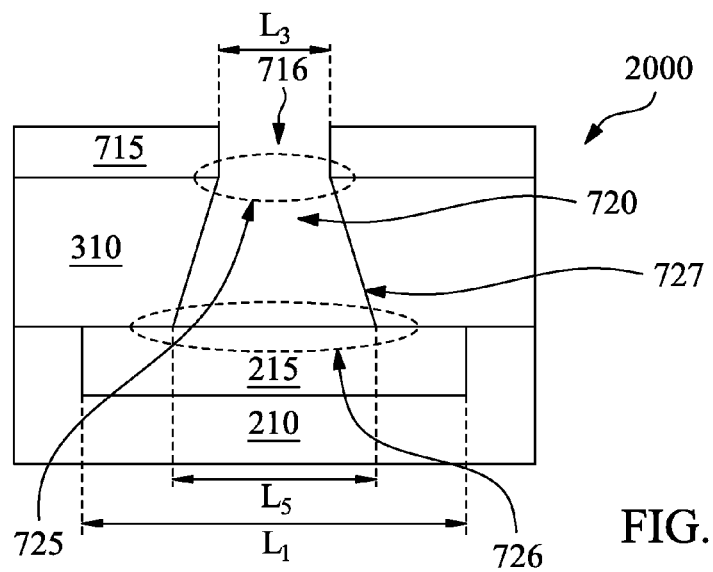
FIG. 9B is a cross-sectional view of an example device in accordance with some embodiments, along the line A-A in FIG. 9A.
Figure 9C:
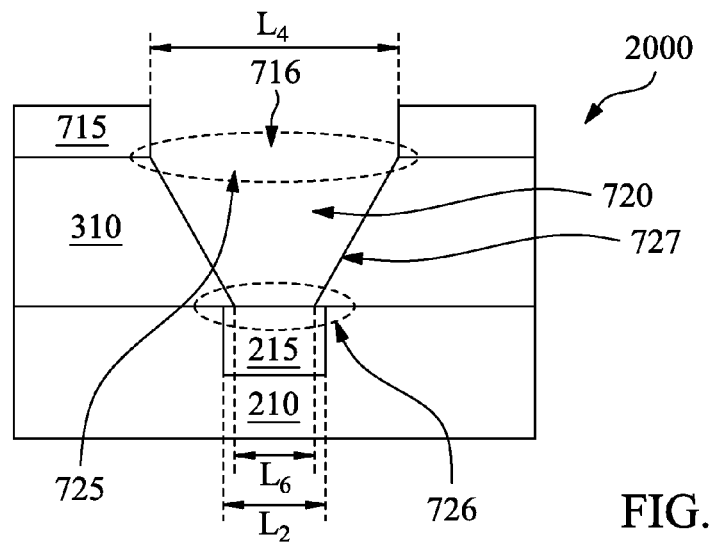
FIG. 9C is a cross-sectional view of an example device in accordance with some embodiments, along the line B-B in FIG. 9A.
Figure 9D:
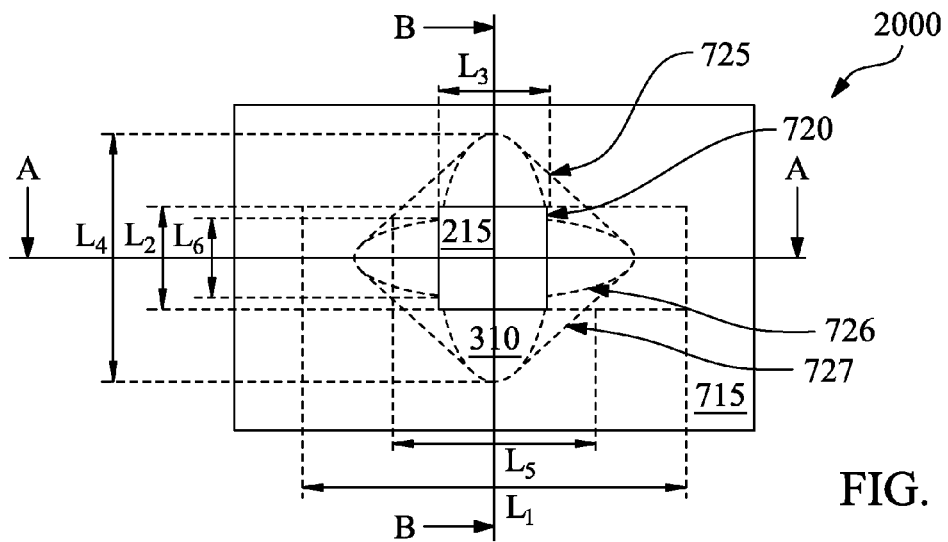
FIG. 9D is a top view of an example of a device in accordance with some embodiments.
Figure 9E:
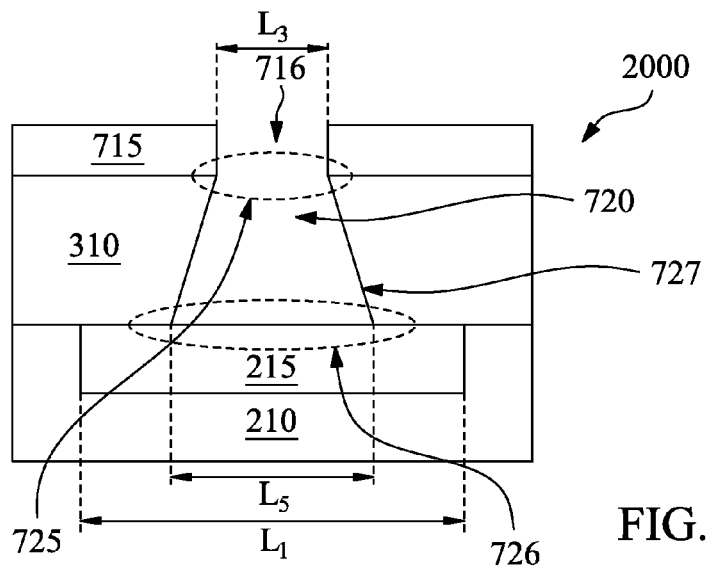
FIG. 9E is a cross-sectional view of an example device in accordance with some embodiments, along the line A-A in FIG. 9D.
Figure 9F:
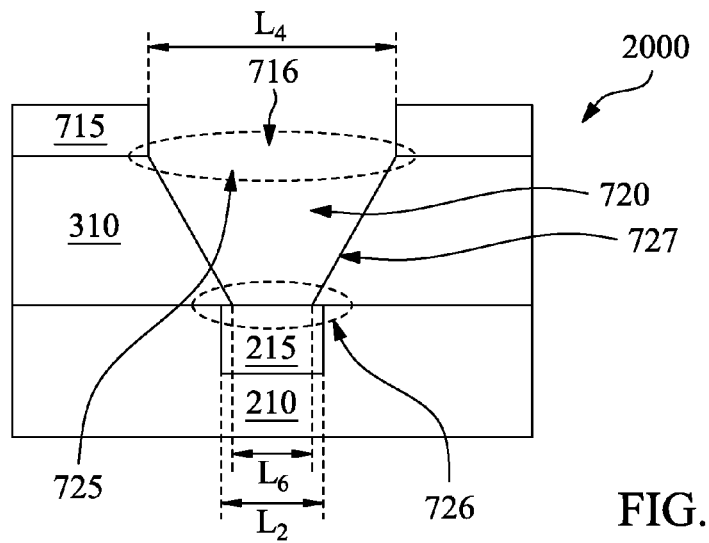
FIG. 9F is a cross-sectional view of an example device in accordance with some embodiments, along the line B-B in FIG. 9D.
Figure 10A:
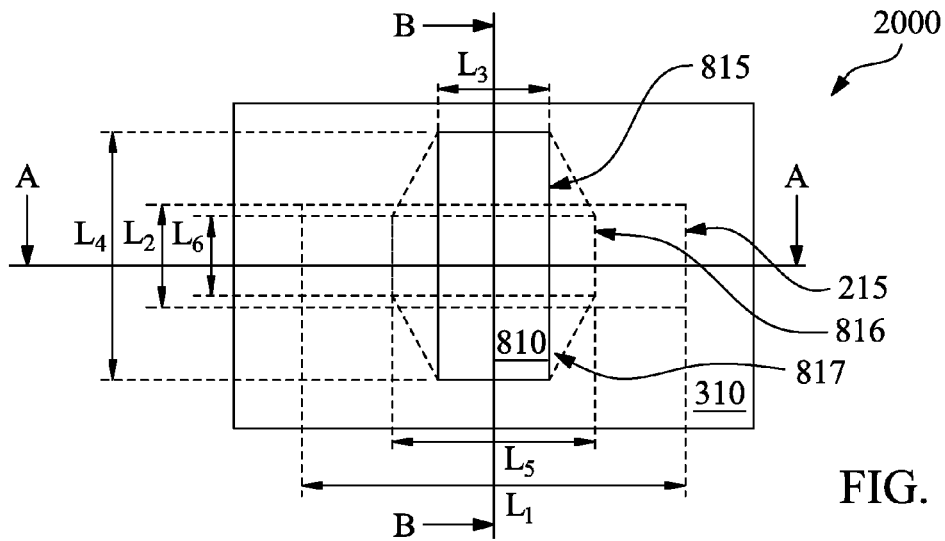
FIG. 10A is a top view of an example of a device in accordance with some embodiments.
Figure 10B:
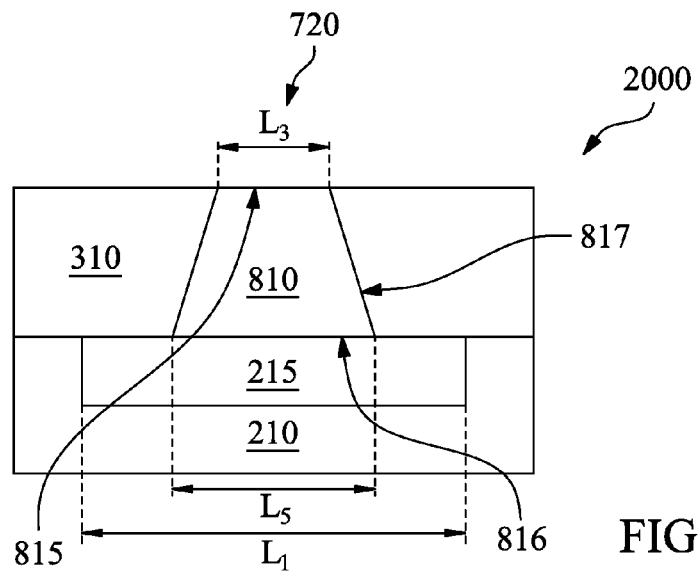
FIG. 10B is a cross-sectional view of an example device in accordance with some embodiments, along the line A-A in FIG. 10A.
Figure 10C:
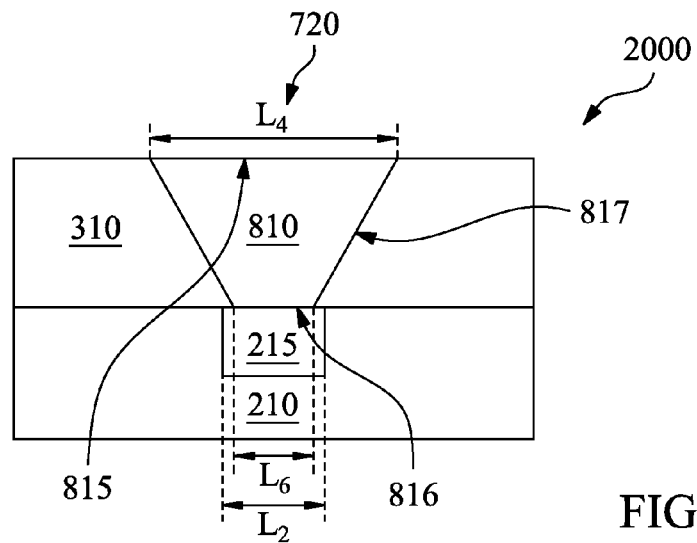
FIG. 10C is a cross-sectional view of an example device in accordance with some embodiments, along the line B-B in FIG. 10A.
Figure 11A:
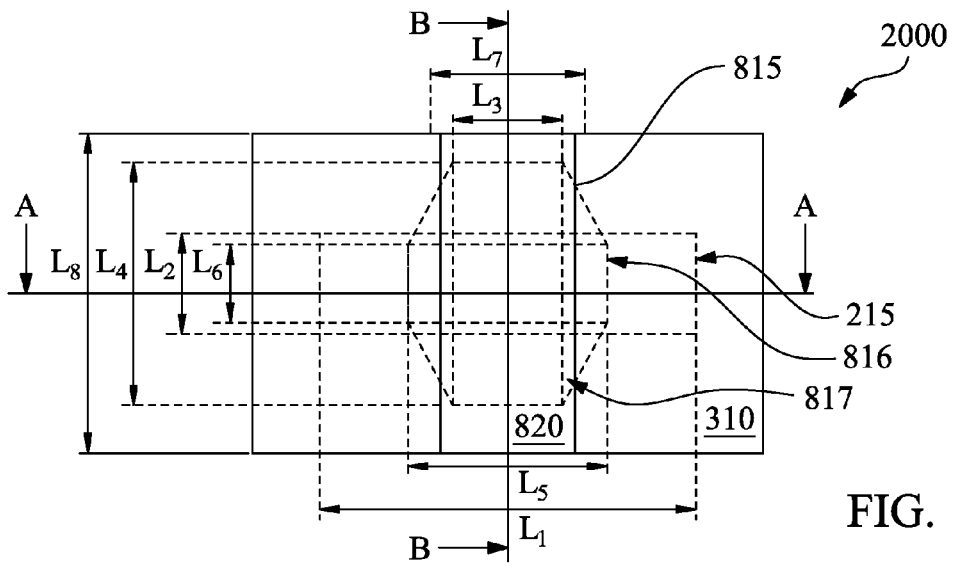
FIG. 11A is a top view of an example of a device in accordance with some embodiments.
Figure 11B:
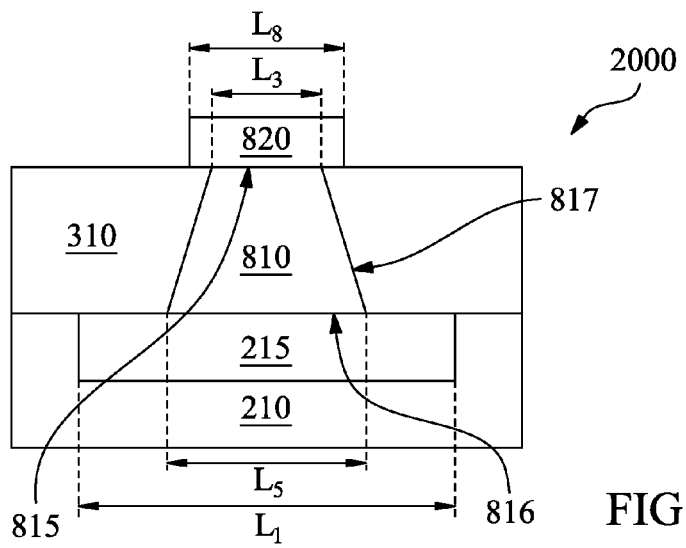
FIG. 11B is a cross-sectional view of an example device in accordance with some embodiments, along the line A-A in FIG. 11A.
Figure 11C:
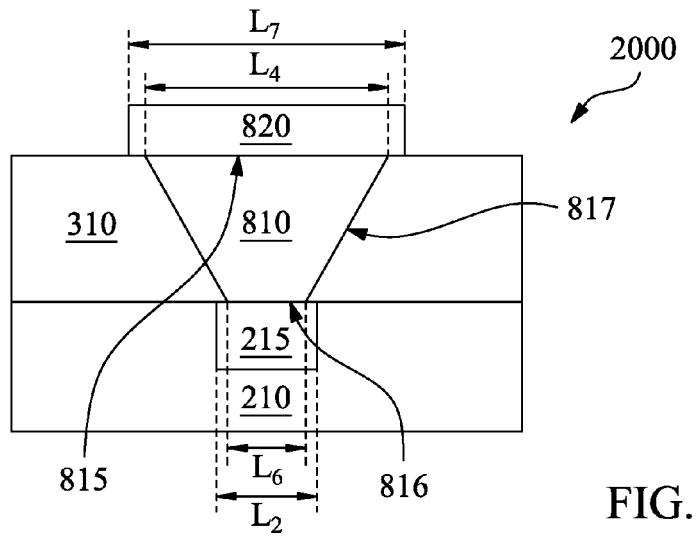
FIG. 11C is a cross-sectional view of an example device in accordance with some embodiments, along the line B-B in FIG. 11A.

FIG. 7 is a flowchart of another example method 1000 for fabricating the device 2000. The steps 1002 and 1004, are similar to those discussed above in steps 102 and 104 of method 100. Thus, the discussion above with respect to steps 102 and 104 is applicable to the steps 1002 and 1004, respectively. The present disclosure repeats reference numerals and/or letters in the various embodiments. This repetition is for the purpose of simplicity and clarity such that repeated reference numerals and/or letters indicate similar features amongst the various embodiments unless stated otherwise.

Referring to FIGS. 7 and 8A-8D, the method 1000 proceeds to step 1006 by forming a patterned HM layer 715 over the first material layer 310, having a HM opening 716. The patterned HM layer 715 is formed similarly in many respects to the HM 410 discussed above in association with FIGS. 3A-3D.

The HM opening 716 may include a rectangular shape (shown in FIG. 8A), an oval shape (shown in FIG. 8D), or other proper shape. The HM opening 716 may have the third length $L_3$ extending along the first direction A-A and the fourth length $L_4$ extending along the second direction B-B. In some embodiments, the third length $L_3$ is shorter than the fourth length $L_4$. The HM opening 716 aligns to the substrate feature 215 such that, in a top view, the HM opening 716 overlaps with a portion of the substrate feature 215. In such a scenario, the longer length of the HM opening 716, the fourth length $L_4$, extends along a different direction than the longer length of the substrate feature 215, the first length $L_1$.

Referring to FIGS. 8 and 9A-9C, the method 1000 proceeds to step 1008 by etching the first material layer 310 through the HM opening 716 to form an opening feature 720. In the present embodiment, the first material layer 310 is etched by the DA plasma etch process, which is similar in many respects to those discussed above in association with FIGS. 4D and 4E. The hole (or trench) feature 720 is formed such that its top opening 725 extends along the second direction B-B while its bottom opening 726 extends along the first direction A-A. The top opening 725 has a similar shape as the HM opening 716. In some embodiments, the bottom opening 726 has a similar shape as the HM opening 716. In some embodiments, the bottom opening 726 has a different shape than the HM opening 716. The hole feature 720 has sidewall profile 727, which may include a straight line profile, or a curvature profile.

In one embodiment, the etching bias along the first direction A-A is a positive etching bias while the etching bias along the second direction B-B is a negative etching bias. In such a scenario, the top opening 725 has a similar shape and size (having the third length $L_3$ and the fourth length $L_4$) as the HM opening 716. The bottom opening 726 (over the substrate feature 215) has the fifth length $L_5$ along the first direction A-A, which is longer than the third length $L_3$ and a sixth length $L_6$ along the second direction B-B, which is shorter than the fourth length $L_4$. Since both of the substrate feature 215 and the bottom opening 726 have their longer lengths, $L_1$ and $L_5$, along the first direction A-A, it reduces process alignment constrains along the first direction A-A and also provides a larger overlap between the first material feature 215 and the bottom opening 726.

Referring to FIGS. 8 and 10A-10C, the method 1000 proceeds to step 1010 by filling in the hole feature 720 to form a second material feature 810. The patterned HM 715 is removed by a proper etching process, such as photoresist stripping process prior to filling in the hole feature 720 with the second material feature 810. The second material feature 810 may include a conductive layer such as polysilicon, metal, and/or other suitable material. The second material feature 810 may also include a dielectric layer, such as silicon oxide, silicon nitride, or silicon oxynitride, low-k dielectric material, and/or other suitable materials. The second material feature 810 is chosen to be different material than the first material layer 310. For example, the first material layer 310 is a dielectric material while the second material feature 810 is a conductive material. The second material feature 810 may be filled in the hole feature 720 by suitable techniques, such as CVD, ALD, PVD, thermal oxidation, spin-on coating, or combinations thereof, or other suitable techniques. A CMP may be performed to polish back excessive second material feature 810.

In the present embodiment, the second material feature 810 has a similar body shape as the hole feature 720, such that it has a top surface 815 extending along the second direction B-B a longer distance than first direction A-A and a bottom surface 816 (in physical contact with the substrate feature 215) extending along the first direction A-A a longer distance than second direction B-B. The bottom surface 816 is in physical contact with at least a portion of the surface of the substrate feature 215.

Referring to FIGS. 8 and 11A-11C, the method 1000 proceeds to step 1012 by forming a third material feature 820 over the second material feature 810. The third material feature 820 is formed similarly in many respects to the second material feature 620 discussed above in association with FIGS. 6A-6C. The third material feature 820 may include a conductive layer such as polysilicon, metal, and/or other suitable material. The third material feature 820 may also include a dielectric layer, such as silicon oxide, silicon nitride, or silicon oxynitride, low-k dielectric material, and/ or other suitable materials. The third material feature 820 is chosen to be different material than the first material layer 310. For example, the third material feature 820 is a metal layer while the first material layer 310 is a dielectric material.

The third material feature 820 is physical in contact with the top surface 815 of the second material feature 810. In the present embodiment, the third material feature 820 has the seventh length $L_7$ along the first direction A-A and the eighth length $L_8$ along the second direction. In some embodiments, the eighth length $L_8$ is greater than the seventh length $L_7$. Since both of the third material feature 820 and the top surface 815 of the second material feature 810 have their longer lengths, $L_8$ and $L_4$, along the second direction B-B, it reduces process alignment constrains along the second direction B-B. In some embodiments, the seventh length $L_7$ is greater than the third length $L_3$ of the top surface 815. Thus, the third material feature 820 completely covers the top surface 815 of second material feature 810 and thereby provides a large overlap between the third material feature 820 and the top surface 815 of second material feature 810.

In some embodiments, the longer length of the substrate feature 215 (the first length $L_1$) is along a different direction than the longer length of the third material feature 820 (the eighth length $L_8$), such as the first length $L_1$ extends along the first direction A-A while the eighth length $L_8$ extends along the second direction B-B. In such a scenario, the second material feature 810 may serve as an interconnection between the substrate feature 215 and the third material feature 820, such that the top surface 815 of second material feature 810 extends along the same direction as the eighth $L_8$ of the third material feature 820 while the bottom surface 816 of second material feature 810 extends along the same direction as the first length $L_1$ of the substrate feature 215. Thus, the second material feature 810 matches both directions of the longer lengths of the third material feature 820 and the substrate feature 215 in which they extend along. This in turn, provides a larger overlay area and increases the critical dimension (CD) design budget during manufacturing.

Additional steps can be provided before, during, and after the method 2000, and some of the steps described can be replaced, eliminated, or moved around for additional embodiments of the method 2000. Other alternatives or embodiments may present without departure from the spirit and scope of the present disclosure. For example, in some embodiments, Based on the above, it can be seen that the present disclosure provides a material feature, which has two end surfaces and they extend along different directions to each other. The material feature provides a better overlap and flexibility to connect with other features at each of its end surface. The material feature demonstrates a robust interconnection structure. The present disclosure also provides methods of fabricating the material feature. The method employs a dynamic-angle plasma etch process to achieve a designed etch bias varying along directions.

The present disclosure provides many different embodiments of a device that provide one or more improvements over existing approaches. In one embodiment, a device includes a substrate feature disposed over a substrate. The substrate feature has a first length extending along a first direction and a second length extending along a second direction. The first length is greater than the second length. The device also includes a first material feature disposed over the substrate. The first material feature has a first surface in physical contact with the substrate feature and a second surface opposite to the first surface. The first surface has a third length extending along the first direction and a fourth length extending along the second direction. The third length is greater than the fourth length. The second surface has a fifth length extending along the first direction and a sixth length extending along the second direction. The sixth length is greater than the fifth length.

In another embodiment, a device includes a substrate feature disposed over a substrate. The substrate feature has a first length extends along a first direction and a second length extends along a second direction. The first length is greater than the second length. The device also includes a first material feature having a first surface in physical contact with the substrate feature and a second surface opposite to the first surface. The first surface has a third length extending along the first direction and a fourth length extending along the second direction. The third length is greater than the fourth length. The second surface has a fifth length extending along the first direction and a sixth length extending along the second direction. The sixth length is greater than the fifth length. The device also includes a second material feature disposed over the first material feature and in physical contact with the second surface. The second material feature has a seventh length extending along the first direction and a eighth length extending along the second direction. The eighth length is greater than the seventh length.

In yet another embodiment, a method includes receiving a substrate having a substrate feature. The substrate feature has a first length extends along a first direction and a second length extends along a second direction. The first length is greater than the second length. The method also includes forming a first material layer over a substrate and in physical contact with the substrate feature, forming a hard mask pattern over a material layer and applying a dynamic-angle (DA) plasma etch to etch the material layer through the hard mask pattern to form a first material feature. An angle of incidence of a plasma flux with respect to a normal line of the first material layer changes in a dynamic mode during the etching process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
    a first feature disposed over a substrate;
    a second feature disposed over the first feature, wherein the second feature has a bottom surface in physical contact with the first feature and a top surface opposite to the bottom surface, wherein a dimension of the second feature along a first direction continuously increases as a height of the second feature increases from the bottom surface to the top surface, another dimension of the second feature along a second direction continuously decreases as the height of the second feature increases from the bottom surface to the top surface, and the first and second directions are different; and
    a third feature disposed over the second feature and in physical contact with the top surface, wherein the third feature is longer along the first direction than along the second direction, and the first feature is longer along the second direction than along the first direction.

2. The device of claim 1, wherein the second direction is perpendicular to the first direction.

3. The device of claim 1, wherein:
    the first feature includes a first conductive line;
    the second feature includes a conductive material; and
    the third feature includes a second conductive line.

4. The device of claim 1, wherein the second feature includes a first sidewall and a second sidewall, the first sidewall is trapezoid, and the second sidewall is inverted trapezoid.

5. The device of claim 1, wherein the second feature is embedded in a dielectric layer and in direct contact with the dielectric layer.

6. The device of claim 1, wherein the second feature is embedded in a dielectric layer.

7. A device comprising:
    a first conductive feature disposed over a substrate, wherein the first conductive feature is shorter along a first direction than along a second direction different from the first direction;
    a second conductive feature having a first surface in physical contact with the first conductive feature and a second surface opposite to the first surface, wherein a dimension of the second conductive feature along the first direction continuously increases as a height of the second conductive feature increases from the first surface to the second surface, another dimension of the second conductive feature along the second direction continuously decreases as the height of the second conductive feature increases from the first surface to the second surface; and the second conductive feature is embedded in a dielectric layer; and
    a third conductive feature disposed over the second conductive feature and in physical contact with the second surface, wherein the third conductive feature is longer along the first direction than along the second direction.

8. The device of claim 7, wherein the second direction is perpendicular to the first direction.

9. The device of claim 7, wherein the first surface has a same shape as the second surface and a center of the second surface is vertically aligned with a center of the first surface.

10. The device of claim 7, wherein the first surface and the second surface have an elliptical shape or an rectangular shape.

11. The device of claim 7, wherein:
    the first conductive feature includes a first metal line;
    the second conductive feature includes a via; and
    the third conductive feature includes a second metal line.

12. The device of claim 7, wherein the second conductive feature includes a first sidewall and a second sidewall, wherein the first sidewall is trapezoid and the second sidewall is inverted trapezoid.

13. The device of claim 7, wherein the first conductive feature includes a gate electrode.

14. A device, comprising:
    a first metal layer disposed over a substrate and having a first metal line spanning in a first direction;
    a second metal layer disposed over the first metal layer and having a second metal line spanning in a second direction different from the first direction; and
    a conductive via feature interposed between the first metal layer and the second metal layer and configured to vertically connect the first metal line to the second metal line, wherein the conductive via feature is surrounded by a single dielectric layer, wherein the conductive via feature includes:
        a bottom surface contacting the first metal line and having an elongated shape with a longitudinal axis oriented in the first direction; and
        a top surface contacting the second metal line and having an elongated shape with a longitudinal axis oriented in the second direction.

15. The device of claim 14, wherein the bottom surface and the top surface have a same shape and a center of the top surface is vertically aligned with a center of the bottom surface.

16. The device of claim 14, wherein the first direction is perpendicular to the second direction.

17. The device of claim 1, wherein a center of the bottom surface is vertically aligned with a center of the top surface.

18. The device of claim 1, wherein each of the bottom surface and the top surface is an elliptical shape or a rectangular shape.

19. The device of claim 14, wherein a dimension of the conductive via feature along the first direction continuously decreases as a height of the conductive via feature increases from the bottom surface to the top surface, another dimension of the conductive via feature along the second direction continuously increases as the height of the conductive via feature increases from the bottom surface to the top surface.

20. The device of claim 19, wherein each of the top and bottom surfaces has an elliptical shape.

* * * * *